(12) United States Patent
Ehrler

(10) Patent No.: US 7,010,475 B2
(45) Date of Patent: Mar. 7, 2006

(54) DERATING FACTOR DETERMINATION FOR INTEGRATED CIRCUIT LOGIC DESIGN TOOLS

(75) Inventor: Timothy J. Ehrler, Glendale, AZ (US)

(73) Assignee: Koninklijke Philips Electronics N.V., Eindhoven (NL)

(*) Notice: Subject to any disclaimer, the term of this patent is extended or adjusted under 35 U.S.C. 154(b) by 275 days.

(21) Appl. No.: 10/358,979

(22) Filed: Feb. 5, 2003

(65) Prior Publication Data
US 2003/0182098 A1 Sep. 25, 2003

Related U.S. Application Data

(63) Continuation of application No. 09/303,833, filed on May 3, 1999, now abandoned.

(51) Int. Cl.
G01B 3/52 (2006.01)
G06F 17/50 (2006.01)
G06F 17/10 (2006.01)

(52) U.S. Cl. ............... 703/15; 703/2; 703/14; 703/16; 716/4; 716/6; 702/34

(58) Field of Classification Search ............ 703/2, 703/14–15; 716/4, 6; 702/34
See application file for complete search history.

(56) References Cited

U.S. PATENT DOCUMENTS

| | | | |
|---|---|---|---|
| 5,274,568 A * | 12/1993 | Blinne et al. ............ 364/489 |
| 5,452,225 A | 9/1995 | Hammer | |
| 5,487,018 A * | 1/1996 | Loos et al. ............ 364/489 |
| 5,500,808 A | 3/1996 | Wang | |
| 5,548,539 A | 8/1996 | Vlach et al. | |
| 5,559,715 A * | 9/1996 | Misheloff ............ 364/488 |
| 5,579,510 A | 11/1996 | Wang et al. | |
| 5,625,803 A | 4/1997 | McNelly et al. | |
| 5,640,328 A | 6/1997 | Lam | |
| 5,650,938 A | 7/1997 | Bootehsaz et al. | |
| 5,663,076 A | 9/1997 | Rostoker et al. | |
| 5,692,160 A | 11/1997 | Sarin | |
| 5,726,902 A | 3/1998 | Mahmood et al. | |
| 5,825,658 A | 10/1998 | Ginetti et al. | |
| 5,835,380 A | 11/1998 | Roethig | |
| 5,838,947 A | 11/1998 | Sarin | |
| 5,841,672 A | 11/1998 | Spyrou et al. | |
| 5,870,586 A | 2/1999 | Baxter | |
| 5,903,468 A * | 5/1999 | Misheloff et al. ......... 364/488 |
| 6,477,471 B1 * | 11/2002 | Hedstrom et al. ............ 702/34 |

OTHER PUBLICATIONS

Peattie, C.G. "Elements of Semiconductor-Device Reliability." Proc. of the IEEE, Feb. 1974. vol. 62, No. 2, pp. 149-168.*

(Continued)

*Primary Examiner*—Paul L. Rodriquez
*Assistant Examiner*—Ayal Sharon
(74) *Attorney, Agent, or Firm*—Peter Zawilski

(57) ABSTRACT

An integrated circuit development library is provided that characterizes several different logic device cells. The library specifies a number of different timing relationships for each of the logic device cells. These timing relationships are evaluated for each of the logic device cells at a first derating condition with a first simulator to provide a first set of derated condition values. The first set of derated condition values each correspond to one of the timing relationships evaluated. A first derating factor is calculated from the first set of derated condition values for estimating derated performance of an integrated circuit with a second simulator. This integrated circuit is developed from one or more of the logic device cells of the library.

6 Claims, 5 Drawing Sheets

OTHER PUBLICATIONS

Hakim, E.B. et al. "A Framework for Reliability Modeling of Electronics." Proc. of Tactical Communications Conf., 1994. May 10-12, 1994. vol. 1, pp. 317-324.*

Open Verilog International (OVI) standards committee "Advanced Library Format (ALF) for ASIC Cells & Blocks containing Power, Timing, Functional and Physical Information for Synthesis, Analysis and Test", Version 1.0, Nov. 14, 1997. http://www.eda.org/alf/.*

Wolfgang Roething, PhD, Amir Zarkesh, PhD, Mike Andrews, Ambar Sarkar, PhD, Renlin Chang, and Yatin Trivedi, *ALF Advanced Library Format for ASIC Cells and Blocks, containing Power, Timing, Functional and Physical Information for Synthesis, Analysis and Test*, Open Verilog International, California, Mar. 1996.

Email Communication From: Paul Wiscombe to Tom VandenBerghe, Apr. 17, 1997.

Email Communication From: Tim Ehler to Amir, May 19, 1997.

Email Communication From: Roethig to McCormic, Jul. 18, 1997.

Open Verilog International (OVI) Standards Committe "Advanced Library Format (ALF) for ASIC Cells & Blocks containing Power, Timing, Functional and Physical Information for Synthesis, Analysis and Test", Version 1.0, Nov. 14, 1997. http:/www.eda.org/alf/.

* cited by examiner

DERATING FACTOR DETERMINATION FOR INTEGRATED CIRCUIT LOGIC DESIGN TOOLS

CROSS-REFERENCE TO RELATED APPLICATIONS

The present application is a continuation of U.S. patent application Ser. No. 09/303,833 filed 3 May 1999 now abandoned.

BACKGROUND OF THE INVENTION

The present invention relates to the design and simulation of integrated circuit logic, and more particularly, but not exclusively, relates to the determination of derating factors to improve agreement between different integrated circuit design tools.

Computer-aided simulations and evaluations typically play a significant role in the development of a new integrated circuit design. As integrated circuit designs have become more complex, a complicated collection of design tools have arisen. Among these is the cell-level simulator that is used to gauge performance of individual logic cells made available by a given integrated circuit manufacturer. Typically, this type of simulator characterizes the behavior of the individual cells, such as basic combinational logic gates of the NAND, NOR, XOR, AND, OR, and INVERTER variety; more sophisticated combinational logic devices like multiplexors, counters, decoders, and encoders; and sequential logic devices like flip-flops and registers. Commonly, descriptions of these and other cells are provided by the manufacturer in the form of a computer readable library for Application Specific Integrated Circuit (ASIC) development using other higher level, design tools.

Among the higher level tools utilizing such cell libraries are logic synthesis programs that select and arrange the cells to provide the overall logic function of a desired integrated circuit design. Synthesis tools also typically interact with other tools that optimize circuit layout and analyze various circuit parameters to enhance development. Because of the complexity and sophistication of tools of this kind, a specialized industry of relatively few suppliers has arisen. Consequently, most ASIC manufacturers seek to provide a library of cell descriptions that is compatible with these higher level design tools.

Unfortunately, in striving to achieve compatibility, compromises are often made regarding certain library parameters. As a result, performance data provided by cell-level simulators may not always agree with higher level design tools. One particular area where disagreement may arise regards simulation under different operating conditions. Indeed, the techniques used by cell simulators to derate integrated circuit performance in terms of temperature, supply voltage, and process technology variation may be quite different from higher level tools. One reason for this difference is that application of cell-level derating techniques to all the cells in a given logic design may result in having to evaluate thousands of timing arcs. To reduce this computational burden, higher level tools sometimes utilize a set of derating factors to characterize all the cells in the library.

One common, higher level synthesis tool called "Design Compiler" is provided by Synopsys, Inc. of Mountain View, Calif. For this tool, derated performance is determined from a set of thirty different derating factors called "kfactors," that are provided as part of the cell description library. The kfactors are grouped in three sets corresponding to process, voltage, and temperature. Each of the three sets has ten members corresponding to different types of timing arcs that are listed as follows: (1) propagation delay for a rising logic signal, (2) propagation delay for a falling logic signal, (3) transition delay for a rising logic signal, (4) transition delay for a falling logic signal, (5) setup time for a rising logic signal, (6) setup time for a falling logic signal, (7) hold time for a rising logic signal, (8) hold time for a falling logic signal, (9) minimum pulse width time for a high logic state, and (10) minimum pulse width time for a low logic state. The following kfactors numbered 1–10 individually designate each timing arc type for the process-based group:
1. k_process_rise_propagation
2. k_process_fall_propagation
3. k_process_rise_transition
4. k_process_fall_transition
5. k_process_setup_rise
6. k_process_setup_fall
7. k_process_hold_rise
8. k_process_hold_fall
9. k_process_min_pulse_width_high
10. k_process_min_pulse_width_low The following kfactors numbered 11–20 individually designate each timing arc type for the voltage-based group:
11. k_volt_rise_propagation
12. k_volt_fall_propagation
13. k_volt_rise_transition
14. k_volt_fall_transition
15. k_volt_setup_rise
16. k_volt_setup_fall
17. k_volt_hold_rise
18. k_volt_hold_fall
19. k_volt_min_pulse_width_high
20. k_volt_min_pulse_width_low The following kfactors numbered 21–30 individually designate each timing arc type for the temperature-based group:
21. k_temp_rise_propagation
22. k_temp_fall_propagation
23. k_temp_rise_transition
24. k_temp_fall_transition
25. k_temp_setup_rise
26. k_temp_setup_fall
27. k_temp_hold_rise
28. k_temp_hold_fall
29. k_temp_min_pulse_width_high
30. k_temp_min_pulse_width_low One prior art scheme used a cell-level simulator according to commonly owned U.S. Pat. No. 5,559,715 to Misheloff to determine kfactors for a cell library based on evaluation of propagation delay of only a single timing arc of only a single cell in the library. This prior art approach used the cell-level simulator to determine the propagation delay at the extremes of a temperature range and the extremes of a voltage range. The average of the propagation delays for the temperature extremes and the average of the propagation delays for the voltage extremes were calculated. The k_temp_rise_propagation kfactor was determined from the temperature extreme average and applied to all 10 of the different timing relationships within the temperature set (numbered 21–30), and the k_volt_rise_propagation kfactor was determined from the voltage extreme average and applied to all 10 of the different timing relationships in the voltage set (numbered 11–20), respectively. Further, with this technique, a value of 1 was used for all 10 kfactors relating to process technology (numbered 1–10), merely indicating the typical condition without deration. Consequently, only three different values were used for the 30 kfactors based on evaluation of only one timing arc type for only one cell in the library.

As the critical dimension of semiconductor transistors continues to decrease, sensitivity to derating conditions correspondingly increases. Thus, in order to reduce deration disparity between cell-level simulators and higher level simulation and evaluation tools, new techniques are needed to characterize derated performance.

SUMMARY OF THE INVENTIONS

One form of the present invention is a unique technique for simulating integrated circuit performance. A further form is a unique system for extracting derating factors.

In another form, a number of timing relationships characterizing a plurality of cells in an integrated circuit development library are uniquely evaluated at a derating condition to provide a corresponding set of derating values. A derating factor is determined from the derating values.

A further form of the present invention includes providing an integrated circuit development library characterizing several different logic device cells. The library specifies a number of different timing relationships for each of the logic device cells. These timing relationships are evaluated for each of the logic device cells at a first derating condition with a first simulator to provide a first set of derated condition values. The first set of derated condition values each corresponds to one of the timing relationships evaluated. A first derating factor is calculated from the first set of derated condition values for estimating derated performance of an integrated circuit with a second simulator. This integrated circuit is developed from one or more of the logic device cells of the library.

Further forms, embodiments, aspects, features, benefits, and advantages of the present invention will become apparent from the detailed description and drawings contained herein.

DESCRIPTION OF PREFERRED EMBODIMENTS

Figure 1:
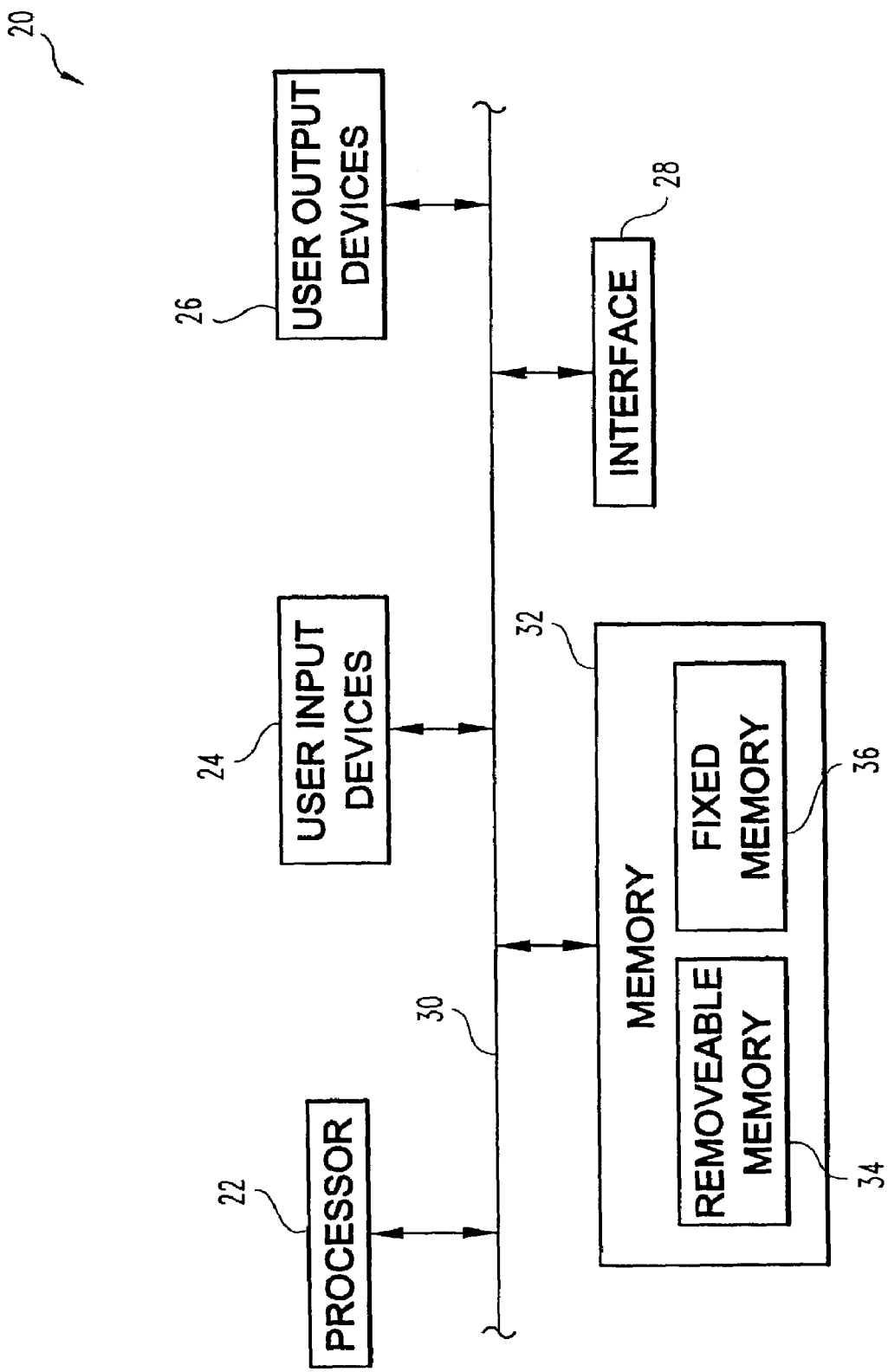
FIG. 1 is a block diagram illustrating a processing system.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 depicts processing system 20 of one embodiment of the present invention. System 20 includes processor 22, user input devices 24, user output devices 26, and interface 28 operatively coupled together by bus 30. Also coupled to bus 30 is memory 32. Memory 32 includes removable memory 34 and fixed memory 36.

Processor 22, input devices 24, output devices 26, interface 28, and memory 32 may be provided in the form of a prepackaged computer unit, comprised of one or more hardware resources distributed on a computer network, or provided in such other form as would occur to those skilled in the art. Processor 22 is preferably of the programmable, solid-state digital variety operable to execute instructions read from memory 32 via bus 30. Input devices 24 preferably include a keyboard, mouse and/or other conventional user input devices as would occur to those skilled in the art. Output devices 26 preferably include a visual display, a printer, and/or other conventional user output devices as would occur to those skilled in the art. Interface 28 may be a network interface, modem or other type of communications and/or equipment interface. In one embodiment, interface 28 is operatively coupled to semiconductor manufacturing equipment, such as photolithographic mask generation equipment (not shown).

Removable memory 34 of memory 32 may be, for example, in the form of a disk or cartridge of the electromagnetic or optical variety, such as a conventional floppy disk or Compact Disk Read Only Memory (CD ROM). Fixed memory 36 preferably includes the read/write solid-state semiconductor variety, but may alternatively or additionally include the electromagnetic variety (such as a hard disk drive), optical variety (such as a CD ROM), or such other variety as would occur to those skilled in the art. Nonetheless, in other embodiments, memory 32 may be solely comprised of one type of memory.

Figure 2:
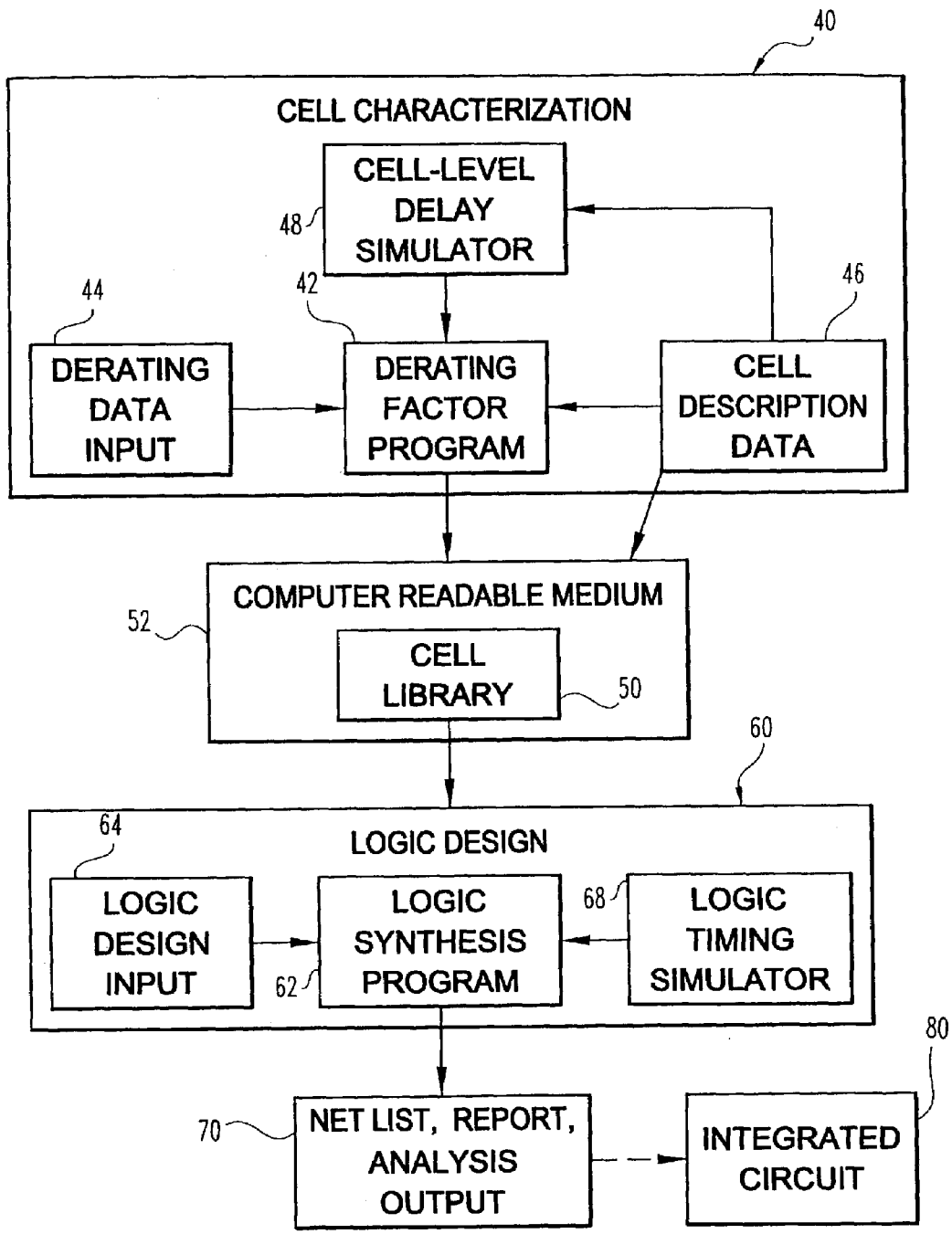
FIG. 2 is a block diagram depicting selected operational elements of the system of FIG. 1.

Referring additionally to FIG. 2, a block diagram of certain operational elements of system 20 is illustrated. Cell characterization processing block 40 includes cell-level characterization and analysis tools utilized by system 20. Processing block 40 provides a cell-level library 50 on a computer-readable medium 52, such as memory 32 (either removable memory 34, fixed memory 36, or a combination of both). Library 50 is provided to, or at least accessible by, logic processing block 60. Processing block 60 defines logic synthesis and design tools corresponding to a later or "higher" level of logic design development than the cell-level tools of processing block 40. Processing blocks 40 and 60, and library 50 represent information and programs that may be accessed and executed, respectively, by system 20.

Processing block 40 includes derating factor program 42, derating data input 44, cell characterization data 46, and cell-level delay simulator 48. Program 42 is executed to provide derating factors, such as kfactors, that are suitable for use by processing block 60. Program 42 is responsive to derating factor input 44 that may be provided in the form of user input with one or more devices 24, in the form of a data file that resides in memory 32, or in such other form as would occur to those skilled in the art. Program 42 and input 44 are further described in connection with FIGS. 3A, 3B, and 4 hereinafter.

Cell description data 46 include primitive model descriptions, process model technology files, and other cell-level information needed to provide a cell library 50 suitable for use by processing block 60. Cell-level delay simulator 48 provides delay values for each cell to be included in library 50, and is capable of evaluating delay values relative to each of a number of different types of timing arcs. The timing arcs evaluated with cell-level delay simulator 48 include the following ten types: (1) propagation delay for a rising logic signal, (2) propagation delay for a falling logic signal, (3) transition delay for a rising logic signal, (4) transition delay for a falling logic signal, (5) setup time for a rising logic signal, (6) setup time for a falling logic signal, (7) hold time for a rising logic signal, (8) hold time for a falling logic signal, (9) minimum pulse width time for a high logic state, and (10) minimum pulse width time for a low logic state. More preferably, simulator 48 operates in accordance with commonly owned U.S. Pat. No. 5,559,715 to Misheloff that is hereby incorporated by reference in its entirety herein. Furthermore, commonly owned U.S. Pat. No. 5,726,902 to Mahmood et al.; U.S. Pat. No. 5,692,160 to Sarin; and U.S. Pat. No. 5,487,018 to Loos et al. are hereby incorporated by reference in their entirety herein. These references provide additional information concerning cell-level characterization and description techniques that may be utilized in connection with the present invention.

Processing block 60 includes logic design input 64, logic synthesis program 62, and logic timing simulator 68. Input 64 may be provided via one or more user input devices 24 to direct the operation of program 62. Program 62 is responsive to input 64 and logic timing analysis performed with simulator 68 to prepare and evaluate logic designs composed of cells selected from library 50.

Processing block 60 selectively provides netlists, reports, analysis, and other information characteristic of an integrated circuit logic design developed from the cells of library 50 as output 70. Output 70 may be provided via one or more output devices 26 of system 20. Also, data from output 70 may be utilized to direct operation of semiconductor manufacturing equipment to provide an integrated circuit 80 in accordance with the logic design synthesized by processing block 60 with cells described by library 50. Integrated circuit 80 is symbolically shown in FIG. 2 as being linked to output 70. Interface 28 of system 20 may be utilized to provide corresponding data to semiconductor manufacturing equipment.

According to the preferred embodiments, program 62 and simulator 68 are supplied by Synopsys, Inc. under model no. 1997.08. Synopsys Inc. has a business address of 700 E. Middlefield Rd., Mountain View, Calif. 94043-4033; and simulator 48 operates in accordance with U.S. Pat. No. 5,559,715 to Misheloff (the "Misheloff type"). For this arrangement, non-linear delay values are passed to simulator 68 via library 50 as a function of two dependent parameters: (1) input transition time and (2) output loading (capacitance). This relationship is defined at discrete points within a two-dimensional array, indexed by each of the two dependent parameters. A template identifies the index parameters and index points within a delay value array for each of the two array dimensions. An example of such a template is given as follows in terms of the Synopsys library format language as TP1:

```
lu_table_template(T3x3) {
variable_1: input_net_transition;
variable_2: total_output_net_capacitance
index_1("0.0,0.5,1.0");
index_2("0.0,0.2,0.6");
}
```

A pair of index values from TP1 are utilized to reference a given delay value in the two-dimensional delay value array TB1. An example of a delay value array TB1 in the Synopsys library format language that may be referenced with template TP1 is given as follows:

```
rise_propagation(T3x3) {
values ("0.00, 0.05, 0.20",
"0.10, 0.25, 0.45",
"0.25, 0.55, 0.95")
}
```

In this case, array TB1 provides propagation delay values for a rising logic signal. Therefore, for an input net transition of 0.5 and a total output net capacitance of 0.2, the rise propagation is 0.25. While a 3 by 3 element array (3×3) example is given, in practice, delay tables are typically larger. In one preferred embodiment, the delay tables are 64 by 64 element arrays (64×64). For other types of timing arcs besides propagation delay for a rising signal, the variable indices may vary. For example, for the setup and hold type of timing arcs, the variable indices relate net transition time to a reference clock and data. In another example, for pulse width type timing arcs, the indices relate input net transition time to a selected reference signal.

The values appearing within delay value array TB1 are generated by simulator 48. Simulator 48 determines derated performance as part of the timing calculation for a given timing arc in terms of 13 scaling parameters. In contrast, simulator 68 derates nominal timing results after the timing calculation in terms of the appropriate kfactors. In other words, should the user wish to modify the environmental operating conditions, the appropriate delay derating is applied to the nominal case delay with simulator 68, resulting in derated timing according to the operating condition parameters. In contrast, simulator 48 is of a variety that, while using a model characterized at nominal conditions, individual parameters which make up the overall calculated delay determinations are pre-scaled according to operating condition specifications. Consequently, there is no direct method to provide a single library with simulator 48 for use by simulator 68 that may be readily derated. Instead, derating is performed in terms of a number of kfactors. For ease of reference, these kfactors are again listed as follows:

1. k_process_rise_propagation
2. k_process_fall_propagation
3. k_process_rise_transition
4. k_process_fall_transition
5. k_process_setup_rise
6. k_process_setup_fall
7. k_process_hold_rise
8. k_process_hold_fall
9. k_process_min_pulse_width_high
10. k_process_min_pulse_width_low
11. k_volt_rise_propagation
12. k_volt_fall_propagation
13. k_volt_rise_transition
14. k_volt_fall_transition
15. k_volt_setup_rise
16. k_volt_setup_fall
17. k_volt_hold_rise
18. k_volt_hold_fall
19. k_volt_min_pulse_width_high
20. k_volt_min_pulse_width_low
21. k_temp_rise_propagation
22. k_temp_fall_propagation
23. k_temp_rise_transition
24. k_temp_fall_transition
25. k_temp_setup_rise
26. k_temp_setup_fall 27. k_temp_hold_rise
28. k_temp_hold_fall
29. k_temp_min_pulse_width_high
30. k_temp_min_pulse_width_low The kfactors are calculated by derating factor program 42 and provided to library 50 in a form compatible for use by simulator 68. The kfactors are used as multipliers of operating condition changes in order to calculate delay estimates. Because simulator 48 provides timing information in terms of transition and propagation delays, scaling factors are required for each combination of the three environmental conditions: (1) process, (2) voltage, and (3) temperature (alternatively designated "PVT conditions"); and each of the ten types of timing arcs.

In addition, the library includes an operating conditions group that specifies environmental parameters that impact timing. Within each defined group are attributes for the PVT conditions of process, voltage, and temperature. "Process" is a scaling factor which accounts for manufacturing process characteristics, "voltage" specifies the design's operating voltage, and "temperature" specifies the design's ambient operating temperature. Typically, at least three operating conditions tables are specified within the group as follows:

1. BCCOM—<u>B</u>est <u>C</u>ase <u>COM</u>mercial
2. NCCOM—<u>N</u>ominal <u>C</u>ase <u>COM</u>merical
3. WCCOM—<u>W</u>orst <u>C</u>ase <u>COM</u>merical These operating group tables define best, nominal (typical), and worst case operating conditions, respectively, at which the technology has been characterized. Typically, this information may be supplied as part of input 44 in processing block 40.

The following nomenclature is employed in connection with selected variables used to describe various calculations and mathematical relationships hereinafter:
$C_{item}$=calculated item value;
$D_{item}$=derated item value;
$E_{item}$=item error percentage;
$K_{item}$=item kfactor value;
$M_{item}$=item multiplier value;
$S_{item}$=simulator 48 calculated delay value; and
$\Delta_{item}$=item delta value.

Total delay for a net within an operating condition environment may now be calculated in terms of these variable definitions. For any example focusing on the delay of a rising logic signal, this delay may be calculated as the sum of propagation, transition, and connect delays as shown in equation (1) that follow:

$$D_{Rise}=D_{RisePropagation}+D_{RiseTransition}+D_{Connect} \quad (1)$$

where each individual delay is the product of the calculated delay ($C_{RisePropagation}$, $C_{RiseTransition}$) and the operating condition derating multiplier ($M_{RisePropagation}$, $M_{RiseTransition}$):

$$D_{Rise\ Propagation}=C_{RisePropagation}*M_{RisePropagation}$$

$$D_{Rise\ Transition}=C_{RiseTransition}*M_{RiseTransition}$$

and further where:

| | |
|---|---|
| $D_{RisePropagation}$ | derated rise propagation; |
| $D_{RiseTransition}$ | derated rise transition; |
| $C_{RisePropagation}$ | calculated rise propagation; |
| $C_{RiseTransition}$ | calculated rise transition; |
| $M_{RisePropagation}$ | rise propagation multiplier; and |
| $M_{RiseTransition}$ | rise transition multiplier. |

Because contact delay $D_{Connect}$ is generally independent of derating, it is ignored in subsequent calculations. The following calculations are based on propagation for a rising logic signal example, it being apparent to those skilled in the art how to apply the same techniques to other timing arc types and/or PVT conditions. For the present example, the derating multiplier for the propagation delay for a rising logic signal is given by equation (2) as follows:

$$M_{Rise\ Propagation}=Mp_{RP}*Mv_{RP}*Mt_{RP} \quad (1)$$

where:
$Mp_{RP}=1.0+\Delta_{process}*Kp_{RP}$
$Mv_{RP}=1.0+\Delta_{voltage}*Kv_{RP}$
$Mt_{RP}=1.0+\Delta_{temperature}*Kt_{RP}$ and further where:
$\Delta_{process}=process_{condition}-process_{nominal}$
$\Delta_{voltage}=voltage_{condition}-voltage_{nominal}$
$\Delta_{temperature}=temperature_{condition}-temperature_{nominal}$ Operating condition derating depends on the generated (nominally characterized) library parameters signified by the "nominal" subscript; parameters pertaining to the derating operating condition, namely process, voltage, and temperature signified by the "condition" subscript; and the appropriate kfactor parameters, $Kp_{RP}$, $Kv_{RP}$, $Kt_{RP}$, relevant to the particular timing characteristics being derated; where $Kp_{RP}$, $Kv_{RP}$, $Kt_{RP}$ are alternative representations of kfactors k_process_rise_propagation, k_volt_rise_propagation, and k_temp_rise_propagation. To derive a given kfactor, consider that the overall derating for a timing value, $D_{condition}$, relative to a nominally characterized library value $D_{nominal}$ can be expressed by equation (3) as follows:

$$D_{condition}=D_{nominal}*M_{condition} \quad (3)$$

Dividing both sides of equation (3) by the term $D_{nominal}$, the overall condition multiplier $M_{condition}$ is given by equation (4) as follows:

$$M_{condition}=D_{condition}/D_{nominal} \quad (4)$$

Thus, where $D_{condition}$ and $D_{nominal}$ are known, multiplier factor $M_{condition}$ may be calculated by applying equation (4). For the specific example given in equation (1), multiplier factors $Mp_{RP}$, $Mv_{RP}$, $Mt_{RP}$ may be determined by application of equation (4) to each and then; with the difference values $\Delta_{process}$, $\Delta_{voltage}$, and $\Delta_{temperature}$ being known; the corresponding kfactors $Kp_{RP}$, $Kv_{RP}$, $Kt_{RP}$ may be derived. The following equations (5) and (6) show this derivation in the case the process of kfactor, $Kp_{RP}$:

$$Mp_{RP}=1.0+\Delta_{process}*Kp_{RP} \quad (5)$$

$$Kp_{RP}=(Mp_{RP}-1.0)/\Delta_{process} \quad (6)$$

Where, the "k_process_rise_propagation" kfactor is alternatively represented as $Kp_{RP}$. Likewise, kfactors for the other PVT conditions may be determined, as would be apparent to those skilled in the art.

Figure 3A:
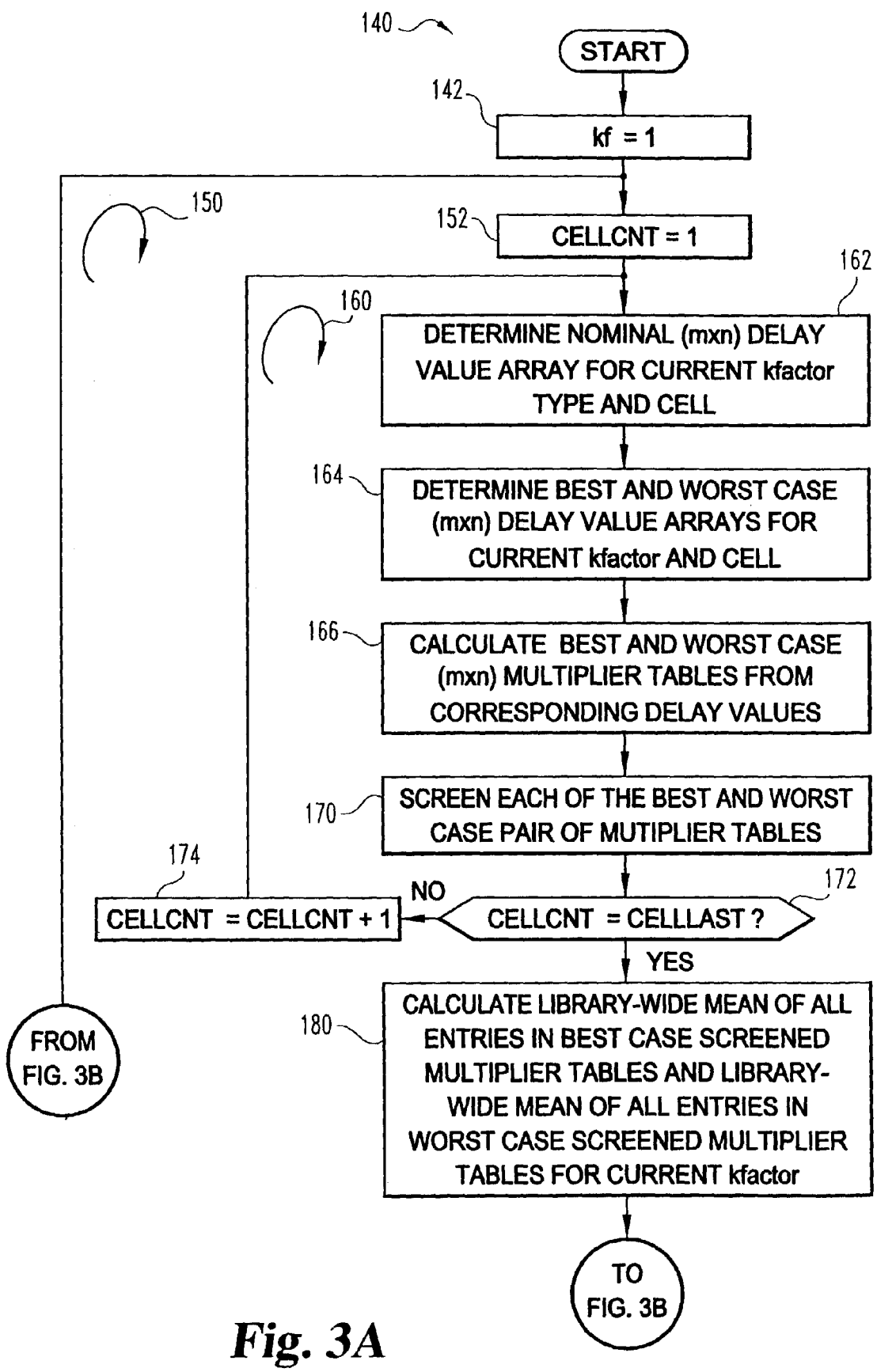
FIGS. 3A and 3B depict a flow chart for a routine performed with the system of FIG. 1.
Figure 3B:
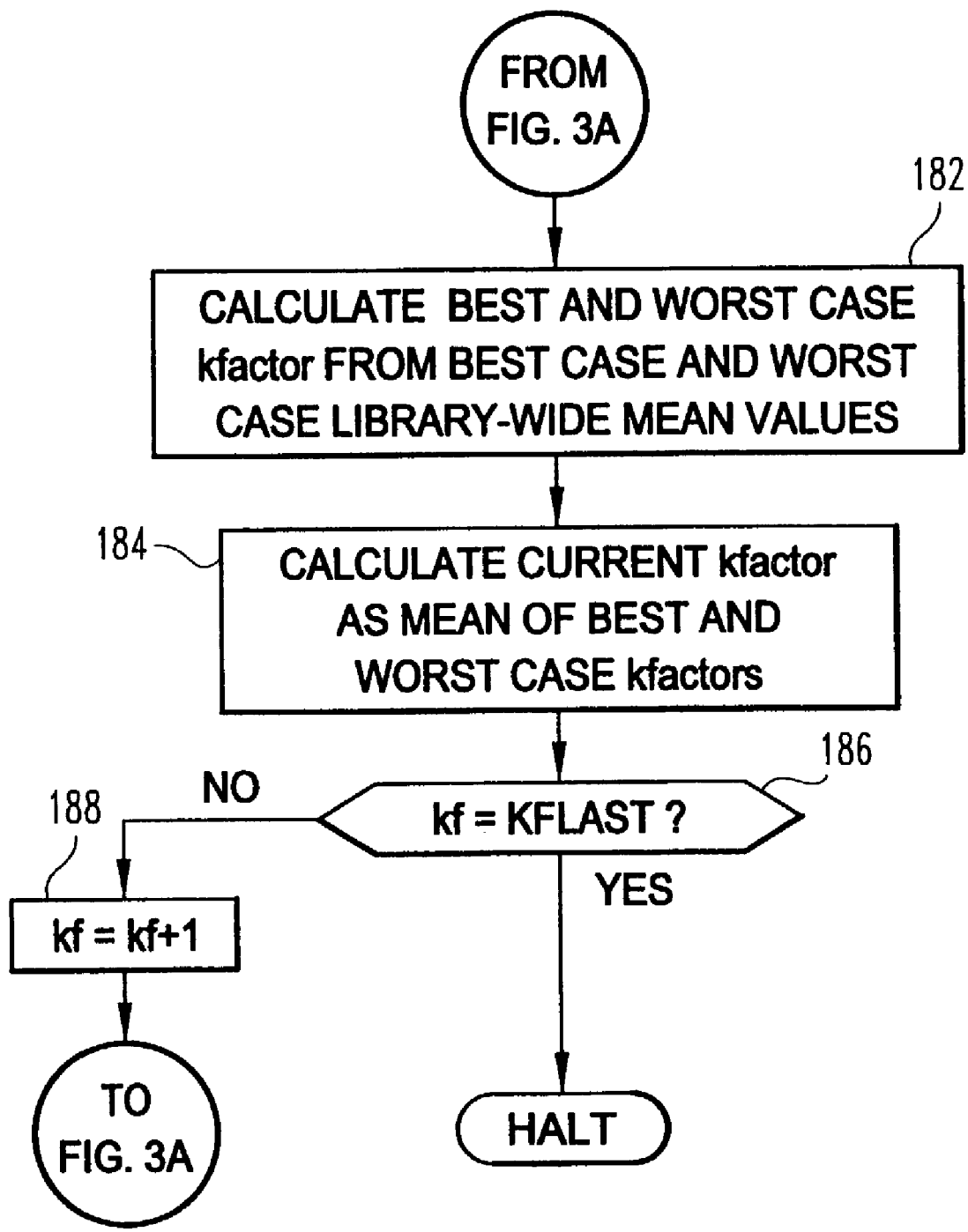

In FIGS. 3A and 3B, routine 140 is described which provides a process to extract kfactors for inclusion in library 50 through a unique application of the relationships defined by equations (1)–(6), cell description data 46, and results from simulator 48. Routine 140 is executed by system 20 as part of program 42 in processing block 40. Routine 140 starts with stage 142 that sets factor counter "kf" to 1 (kf=1). Next kfactor extraction loop 150 is entered. Loop 150 is repeated for the extraction of each kfactor. Upon entering loop 150, routine 140 proceeds to stage 152. In stage 152, cell counter CELLCNT is set to 1 (CELLCNT=1). Next, cell processing loop 160 is entered. Loop 160 is repeated in correspondence with the number of cells in library 50 from which data related to the kfactors may be extracted.

To perform extraction of a given kfactor, each of the ten timing arc types as applicable to the current cell being evaluated is analyzed. It should be appreciated that not all of the ten are types that may be applicable to a given cell. Also, it should be appreciated that for more complex cell types, a significant number of logic paths though the cell may exist that are each analyzed in terms of the different type of timing arcs that apply. For each cell, the one or more applicable arcs are analyzed at seven (7) different characterization points corresponding to nominal, best, and worst case for the different PVT conditions. Each row of table I that follows corresponds to one of these characterization points; where the column entries of a given row define the combination of conditions necessary to define the characterization point for that row:

TABLE I

| Characterization Point | Process | Voltage | Temperature |
|---|---|---|---|
| nominal | nominal | typical | typical |
| process$_{best}$ | best | typical | typical |
| process$_{worst}$ | worst | typical | typical |
| voltage$_{best}$ | nominal | maximum | typical |
| voltage$_{worst}$ | nominal | minimum | typical |
| temperature$_{best}$ | nominal | typical | minimum |
| temperature$_{worst}$ | nominal | typical | maximum |

Furthermore, it should be appreciated that voltage and temperature points for corresponding (best:nominal:worst) cases are (maximum:typical:minimum) and (minimum:typical:maximum) respectively.

In stage 162 of loop 160, a delay value array of "m" by "n" dimension (m×n) of the type described in connection with TB1 is generated using simulator 48 under the nominal condition of table I (first row); where it is preferred m=n=64, corresponding to a 64×64 array size. In stage 164, the best and worst case m×n delay value arrays are determined using simulator 48, resulting in six m×n tables each corresponding to a different characterization point of rows 2–7 of table I. The performance of stages 162, 164 include identifying the minimum, maximum, and nominal values for each PVT condition as provided in the user selected operating conditions group for library 50 to generate the seven characterization points as set forth in Table I.

From the six arrays determined in stage 164 with simulator 48, six m×n best and worst case multiplier array tables are calculated in stage 166; where each best, worst multiplier element is determined in accordance with equations (7) and (8), respectively, as follows:

$$M_{best} = S_{best}/S_{nominal} \quad (7)$$

$$M_{worst} = S_{worst}/S_{nominal} \quad (8)$$

In equations (7) and (8), $S_{nominal}$ is the respective nominal delay value from the nominal delay value array determined in stage 162 and $S_{Best}$, $S_{Worst}$ are the respective best and worst case delay values from the best and worse case delay value arrays determined in stage 164. Correspondingly, for each of the best and worst case PVT conditions, the derating multiplier is calculated for each of the applicable kfactors with respect to the type of timing arc being analyzed.

Figure 4:
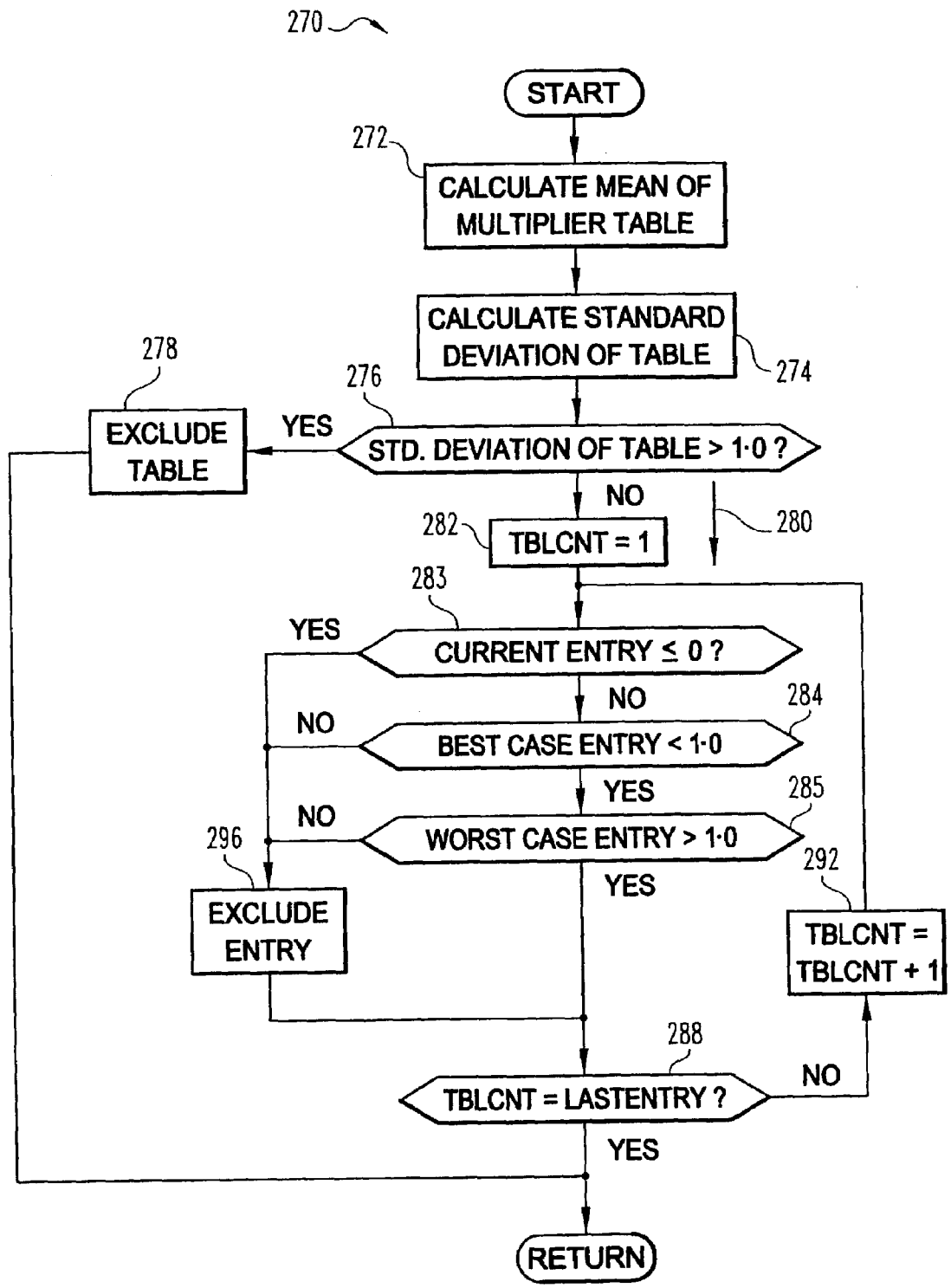
FIG. 4 is a flow chart further illustrating selected aspects of one stage of the routine illustrated in FIGS. 3A and 3B.

Once the six m×n multiplier array tables are determined, in stage 170 each multiplier array table is subjected to a screening process to remove any anomalous values. Referring additionally to FIG. 4, screening process 270 of stage 170 is further described. Each multiplier table determined in stage 166 is separately processed by screening process 270. In other words, process 270 is called by stage 170 for each multiplier table that is screened. Starting with stage 272 of screening process 270, the statistical mean of all entries in the multiplier table currently being processed is calculated, assuming a gaussian distribution. Next, this mean value is utilized in stage 274 to determine the standard deviation of the given multiplier array table being screened. As reflected in conditional 276, if the standard deviation of the table is greater than 1.0, the table is excluded from further kfactor extraction processing in stage 278. Accordingly, process 270 returns to stage 170 to get the next multiplier array table, if any, for screening.

On the other hand, if the table currently being screened had a standard deviation less than or equal to 1.0, screening of each table entry is performed via processing sequence 280. Sequence 280 starts with setting table entry counter TBLCNT to 1 (TBLCNT=1). Next, conditional 283 is encountered which tests whether the current multiplier entry is less than or equal to zero. If so, the current multiplier entry cannot be used as a meaningful source for deriving kfactors and is excluded in stage 296. If the entry is greater than zero (>0), then conditional 284 is encountered which tests if the entry is of the best case type and if so, whether it is less than 1.0. It should be appreciated that, per equation (7), a best case multiplier is expected to be less than one for a best case operating condition. In other words, a best case operating condition is expected to be better than a nominal operating condition. If this expectation is not met for a given multiplier, then any derating factor that is determined from it is likely to be adversely impacted. Thus, if testing of a best case entry by conditional 284 indicates it is 1.0 or greater, then that entry is excluded in stage 296.

Conditional 285 test whether an entry is of the worst case type and, if so, whether it is greater than 1.0. It should be appreciated that, per equation (8), a worst case multiplier is expected to be greater than 1.0 if the worst case operation condition is to be poorer than the nominal operating condition. In other words, a worst case operating condition is expected to be poorer than a nominal operating condition. If this expectation is not met for a given multiplier, then any derating factor that is determined from it is likely to be adversely impacted. Thus, if conditional 285 indicates a worst case entry is less than or equal to 1.0, it is excluded by stage 296.

If conditional 285 indicates the worst case entry is greater than 1.0, then process 270 proceeds to conditional 288 of sequence 280 to determine if this is the last entry or not. Likewise, stage 296 proceeds to conditional 288 after excluding an entry via the tests of conditionals 283, 284, or 285. If it is the last multiplier entry represented by LASTENTRY, (TBLCNT=LASTENTRY), control returns to stage 170 to process the next multiplier array table (if any are left), otherwise entry counter TBLCNT is incremented in stage 292 and control loops back to conditional 283 of sequence 280.

Returning back to FIG. 3A, after screening is completed in stage 170, conditional 172 is encountered to determined if the last cell CELLLAST has been processed or if another cell needs to be evaluated via loop 160 (CELLCNT=CELLLAST?). If there is another cell to analyze (CELLCNT<CELLLAST), stage 174 is encountered which increments the cell counter CELLCNT (CELLCNT=CELLCNT+1). Loop 160 then processes the next cell.

For each cell processed by loop 160, the screened multiplier array tables are retained by routine 140 in memory 32. After the last cell, CELLLAST, has been evaluated by loop 160 as determined by conditional 172, stage 180 is encountered. In stage 180, a best case mean of all entries from all best case multiplier array tables remaining after screening is calculated and a worst case mean of all worst case entries from all multiplier array tables remaining after screening in stage 170 is calculated for the given kfactor being evaluated. The best and worst case mean values, $M_{bestMean}$ and $M_{worstMean}$, are provided by equations (9) and (10), respectively, as follows:

$$M_{bestMean} = (\Sigma M_{best})/M_{bestCount} \text{ for } M_{bestCount} \text{ values} \quad (9)$$

$$M_{worstMean} = (\Sigma M_{worst})/M_{worstCount} \text{ for } M_{worstCount} \text{ values} \quad (10)$$

where, $M_{bestCount}$ and $M_{worstCount}$ are counts of the entries remaining in the best and worst case multiplier array tables, respectively, after screening in stage 170.

Referring additionally to FIG. 3B, routine 140 continues with stage 182. In stage 182, the best case mean kfactor, $K_{bestMean}$, and the worst case mean kfactor, $K_{worstMean}$, corresponding to the current kfactor type as indexed by the factor counter kf are calculated in accordance with equations (11) and (12), respectively, as follows:

$$K_{bestMean} = (M_{bestMean} - 1.0)/\Delta_{best} \quad (11)$$

$$K_{worstMean} = (M_{worstMean} - 1.0)/\Delta_{worst} \quad (12)$$

where:

$$M_{bestMean} = 1.0 + \Delta_{best} * K_{bestMean}$$

$$M_{worstMean} = 1.0 + \Delta_{worst} * K_{worstMean}$$

In stage 184, the value of the current kfactor is then calculated as the mean of the best and worst case kfactor means $K_{bestmean}$ and $K_{worstmean}$, provided by equations (11) and (12), respectively. This calculation is expressed in equation (13) as follows:

$$K_{factor} = (K_{bestMean} + K_{worstMean})/2.0 \quad (13)$$

Conditional 186 is next encountered which tests whether the current kfactor is the last kfactor KFLAST. If there are more kfactors to process (kf<KFLAST), then stage 188 increments the factor counter kf (kf=kf+1) and loop 150 returns to stage 152 of FIG. 3A to reset the cell counter (CELLCNT=1) to perform the cell-by-cell evaluations of loop 160 for the next kfactor being extracted by routine 140. If the last kfactor has been processed in accordance with routine 140 (kf=KFLAST), then routine 140 halts. Accordingly, a set of kfactors is calculated by routine 140 based on a plurality of cells in the library as evaluated with simulator 48. Furthermore, for each cell, a plurality of timing arc types have been included in the evaluation. It has been discovered that this approach to kfactor determination, as contrasted with prior art techniques, provides a much higher degree of agreement with simulator 68 of model number 1997.08 provided by Synopsys relative to a simulator 48 that operates in accordance with U.S. Pat. No. 5,559,715 to Misheloff.

In other embodiments, it is envisioned that the various stages, conditionals, and operations of routine 140, including process 270, may be resequenced, rearranged, altered, combined, deleted, or modified by other procedures as would occur to those skilled in the art. By way of nonlimiting example, stages 162 and 164 may be performed in reverse order. Likewise, in alternative embodiments, the conditionals of sequence 280 may be performed in a different order. In still other embodiments, various stages and operations may be performed in parallel. In another embodiment, the determination of kfactors may not include simulation of all cells and corresponding timing arcs of a given library, but instead be based on only a selected subset of cells and/or timing arcs. In still a further embodiment, kfactors may be extracted from cell-level simulations for some or all library cells and some or all relevant timing arcs as a function of one or more operating points other than the best and worst case extremes. The best and/or worst case values may then be correspondingly extrapolated from the results from those operating points that are simulated. Indeed, in one alternative embodiment, only a single non-nominal operating point is simulated for each of the PVT conditions to characterize variation from nominal. In another alternative embodiment, fewer or more environmental operating conditions than process, voltage, and temperature are considered.

A further embodiment of the present invention includes providing an integrated circuit development library including a plurality of different logic device cell characterizations. This library specifies a number of timing relationships for each of the characterizations. The timing relationships are each one of a predetermined number of different timing relationship types. A set of derating values are determined from a subset of the timing relationships and a derating condition parameter. Each member of this subset is of the same timing relationship type. This determination is performed for each of the different cell timing relationship types to provide a number of different sets of derating values. Each of the different sets of derating values is determined from a different subset of the timing relationships. A plurality of derating factors are calculated to estimate derated performance of an integrated circuit developed from one or more of the different logic device cell characterizations. The derating factors are each representative of a different one of the timing relationship types and are each determined from a corresponding one of the different sets of the derating values.

Other embodiments of the present invention include a processing system having a means for providing a library including a plurality of logic device cell descriptions that each include a number of timing relationships. This means may include a computer readable medium encoded with the library. The system also includes means for determining a number of derating values for characterizing derated performance of each of the logic device cells. Each of these derating values is determined by evaluating a different one of the timing relationships for each of the logic device cell descriptions at a derating condition with a first simulator. Further, the system includes means for calculating a number of derating factors. These derating factors are each determined from a different subset of the derating values and are each applicable to estimate derated performance of an integrated circuit developed from the library with the second simulator. This calculating means may include a processor operable to execute a derating factor extraction program to calculate the derating factors.

All publications, patents, and patent applications cited in this specification are herein incorporated by reference as if each individual publications, patent, or patent application were specifically and individually indicated to be incorporated by reference and set forth in its entirety herein. While the invention has been illustrated and described in detail in the figures and foregoing description, the same is to be considered as illustrative and not restrictive in character, it being understood that only the preferred embodiment has been shown and described and that all changes, equivalents, and modifications that come within the spirit of the invention as defined by the following claims are desired to be protected.

What is claimed:

1. A method, comprising:
   (a) providing an integrated circuit development library characterizing several different logic device cells, the library specifying a number of different timing relationships for each of the logic device cells;
   (b) determining a number of derating values for characterizing derated performance of each of the logic device cells, each of the derating values being determined by evaluating a different one of the timing relationships for each of the logic device cell descriptions at a derating condition with a first simulator; and
   (c) calculating a number of derating factors, the derating factors each being determined from a different subset of the derated condition values, the derating factors being applicable to estimate derated performance of an integrated circuit developed from the library with a second simulator, the calculating of the number of derating factors including:
      establishing a number of best cast multiplier arrays and a number of worst case multiplier arrays; and
      screening each of the best case multiplier arrays and each of the worst case multiplier arrays.

2. The method of claim 1, wherein the derating condition corresponds to one of temperature, voltage, or process.

3. The method of claim 1, further comprising evaluating each of the timing relationships for each of the logic device cells at a different derating condition with the first simulator to provide other derated condition values.

4. An apparatus, comprising: a processing system including:
   means for providing a library including a plurality of logic device cell descriptions each including a number of timing relationships;
   means for determining a number of derating values for characterizing derated performance of each of the logic device cells, each of the derating values being determined by evaluating a different one of the timing relationships for each of the logic device cell descriptions at a derating condition with a first simulator; and
   means for calculating a number of derating factors, the derating factors each being determined from a different subset of the derating values, the derating factors being applicable to estimate derated performance of an integrated circuit developed from the library with a second simulator, and wherein said calculating means includes means for establishing a number of best case multiplier arrays and a number of worst case multiplier arrays and means for screening each of the best case multiplier arrays and each of the worst case multiplier arrays.

5. The apparatus of claim 4, wherein said providing means includes a computer readable medium encoded with said library.

6. The apparatus of claim 4, wherein said calculating means includes a processor operable to execute a derating factor extraction program to calculate said derating factors.

* * * * *